United States Patent
Lee et al.

(10) Patent No.: US 6,733,823 B2
(45) Date of Patent: May 11, 2004

(54) METHOD FOR ELECTROLESS GOLD PLATING OF CONDUCTIVE TRACES ON PRINTED CIRCUIT BOARDS

(75) Inventors: David M. Lee, Hanover, PA (US); Arthur S. Francomacaro, Eldersburg, MD (US); Seppo J. Lehtonen, Columbia, MD (US); Harry K. Charles, Jr., Laurel, MD (US)

(73) Assignee: The Johns Hopkins University, Baltimore, MD (US)

( * ) Notice: Subject to any disclaimer, the term of this patent is extended or adjusted under 35 U.S.C. 154(b) by 0 days.

(21) Appl. No.: 10/114,211

(22) Filed: Apr. 2, 2002

(65) Prior Publication Data

US 2002/0182308 A1 Dec. 5, 2002

Related U.S. Application Data

(60) Provisional application No. 60/281,146, filed on Apr. 3, 2001.

(51) Int. Cl.$^7$ .............................. B05D 5/12; B05D 3/10; B05D 1/18; B05D 1/36
(52) U.S. Cl. .............................. 427/98; 427/8; 427/304; 427/305; 427/125; 427/328; 427/354; 427/600; 427/601; 427/405; 427/437; 427/438
(58) Field of Search .............................. 427/8, 96, 98, 427/304, 305, 125, 328, 337, 353, 354, 600, 601, 405, 437, 438, 443.1, 383.7

(56) References Cited

U.S. PATENT DOCUMENTS 4,503,131 A * 3/1985 Baudrand ............ 428/672
4,695,775 A * 9/1987 Ritzman et al. ............ 314/410
4,699,081 A * 10/1987 Mack ............ 118/691
4,985,072 A * 1/1991 Sahashi et al. ............ 75/246
4,985,076 A * 1/1991 Iacovangelo ............ 106/1.26
5,212,138 A * 5/1993 Krulik et al. ............ 502/230
5,648,125 A * 7/1997 Cane ............ 427/534
5,843,517 A * 12/1998 Ferrier et al. ............ 427/98
5,843,538 A * 12/1998 Ehrsam et al. ............ 427/601
5,910,340 A * 6/1999 Uchida et al. ............ 427/437

FOREIGN PATENT DOCUMENTS

JP     63128790 A  * 6/1988 ............ H05K/3/42
JP     04157168 A  * 5/1992 ............ C23C/18/32

* cited by examiner

*Primary Examiner*—Michael Barr
(74) *Attorney, Agent, or Firm*—Benjamin Y. Roca (57) ABSTRACT

A method of electrolessly gold plating copper on a printed circuit board (PCB). Starting with a copper patterned PCB, steps include: clean with ultrasonic agitation with the PCB initially oriented vertically and gradually moved to a 45° angle; rinse; sulfuric acid bath with ultrasonic and mechanical agitation; rinse; another sulfuric acid bath with ultrasonic and mechanical agitation; plate the copper with palladium with ultrasonic agitation with the PCB initially oriented at a 45° angle and flipped half way through to opposing 45° angle; rinse; post dip in sulfuric acid; rinse; electrolessly nickel plate with mechanical agitation; rinse; nitrogen blow dry; visual inspection for nickel coverage of the copper; hydrochloric acid bath with manual agitation; rinse; if full nickel coverage was not achieved, repeat preceding steps starting with second sulfuric acid bath; gold flash plate to establish a first layer of gold; rinse; autocatalytic gold plate; rinse; and nitrogen blow dry.

22 Claims, 7 Drawing Sheets

METHOD FOR ELECTROLESS GOLD PLATING OF CONDUCTIVE TRACES ON PRINTED CIRCUIT BOARDS

CROSS-REFERENCE TO RELATED APPLICATION

This application claims the benefit of U.S. provisional application No. 60/281,146, filed on Apr. 3, 2001, which is hereby incorporated by reference in its entirety.

BACKGROUND OF THE INVENTION

1. Field of the Invention

The invention relates to gold plating of conductor traces on printed circuit boards and the like. More particularly, the invention relates to electroless gold plating of copper conductors on printed circuit boards and the like for use in connection with bare die attach integrated circuit devices.

2. Description of the Related Art

Printed circuit boards (PCBs) upon which integrated circuits (ICs) are mounted are well known. Printed circuit boards can be made of various materials, including, but not limited to, epoxy glass and polyimide glass. Traditionally, encapsulated IC chips are mounted on substrates such as PCBs with lead fingers, which protrude from the encapsulated ICs, attached to conductive bond sites on the PCB in order to provide electrical paths between the PCB and circuitry within the IC chips. The bond sites on the PCB are electrically part of or are coupled to conductive traces that lead to other circuitry on the PCB and/or to contacts on the edges of the PCB for coupling to off-PCB circuitry. More recently, however, fabrication techniques are being used in which bare dies (i.e., not encapsulated) are bonded directly to PCBs. The bond pads on the top surface of the dies are then wire bonded to the bond sites on the PCB in essentially the same fashion that bond pads on dies are wire bonded to lead frames in traditional, encapsulated IC chips.

Figure 1:
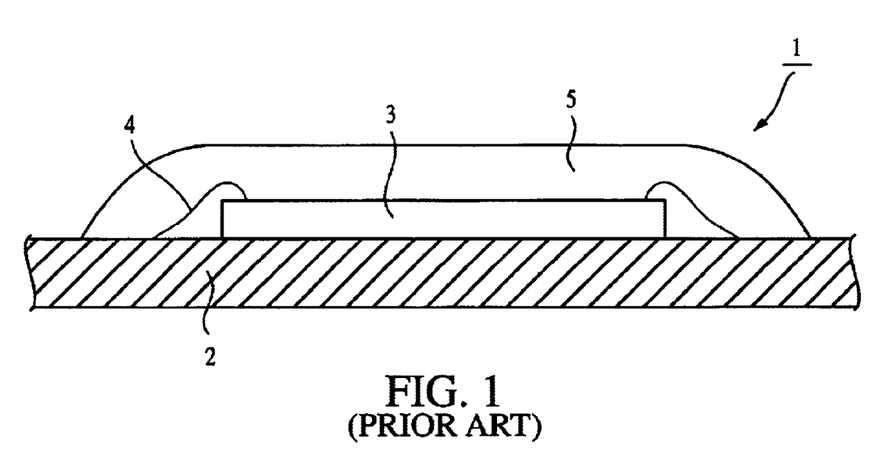
FIG. 1 is a cross-sectional side view of a chip-on-board integrated circuit device of the prior art.

There are several well known bare die attach techniques and assemblies, including assemblies commonly known as multichip (MCMs) and chip-on-board (COB) assemblies. FIG. 1 is a cross-sectional side view of an exemplary chip-on-board assembly 1. The assembly comprises a PCB 2 on which a bare die 3 has been adhered. Bond pads on the top die surface have been wirebonded to contacts on the PCB by wirebonds 4. Finally the die, including the wirebonds 4, has been encapsulated within encapsulant 5 right on the PCB.

These direct die attach assemblies as well as others typically require that the conductive traces, contact points and vias on the PCB be formed of gold plated copper. The gold plating must be of sufficient quality (having fine, uniform grains) and thickness (nominally 0.5 microns, which is about 20 micro-inches) to ensure excellent wire bondability and reliability during long term operation.

Further, for bare die attach techniques, the copper on the PCB must be patterned prior to the gold plating process since gold and copper generally cannot be etched simultaneously with the same etchant. Consequently, performing the copper etching after the gold etching would undermine the gold layer and leave gold cantilevered over the copper, which is not an acceptable condition. Since the boards are patterned before the gold plating process, there typically will not be a continuous circuit path comprising all of the copper on the PCB and, thus, it is impossible, or at least impractical, to gold plate the copper by electroplating techniques. Accordingly, for bare die attach integrated circuits (as well as other integrated circuits), the gold plating process typically is an electroless process, i.e., either immersion, autocatalytic or both. In addition, it typically is desirable to form a barrier layer between the copper and the gold to prevent migration of the copper into the gold and also to ensure excellent adhesion of the gold to the copper.

Multi-layer printed circuit boards commonly include conductively plated through holes to provide interconnection between conductive traces on the various layers of the board. Such through holes may run completely through the PCB assembly from one surface to the opposite surface and, thus, be open at both ends. However, techniques are now well established for providing blind vias in multi-layer printed circuit boards. Blind vias are open at one end but terminate short of the opposite surface of the PCB at one of the intermediate layers. Blind vias conserve real-estate on the circuit board since they do not consume space on layers on which they do not serve an electrical function. Also in furtherance of the ever present desire to reduce the size of circuitry, it is desirable for the through holes and blind vias to have as small a diameter as possible. Particularly, blind vias with diameter to depth aspect ratios of 1:1 up to 1:5 or greater are known in the prior art. However, it has been found to be rather difficult to electrolessly gold plate blind vias with aspect ratios of 1:1 or greater. Particularly, it is difficult to guarantee that sufficient exchange of the electroless nickel and/or gold plating solutions into and out of the blind vias to fully plate the surfaces of the blind vias.

Therefore, it is an object of the present invention to provide a new and/or improved technique for electroless gold plating of conductive traces on printed circuit boards and the like.

SUMMARY OF THE INVENTION

The invention is a technique for electrolessly gold plating copper patterns on a PCB or the like that is particularly suited for use in connection with the manufacture of PCBs upon which bare dies will be mounted. Starting with a printed circuit board (PCB) with patterned copper on its surface and in any vias, one particular, complete process in accordance with the current embodiment of the present invention comprises the following steps:

1. Cleaning the PCB in a bath of cleaning solution with the application of ultrasonic agitation with the PCB initially oriented vertically and gradually moved to a 45° angle to the ground followed by rinsing in a high pressure rinse with de-ionized water;
2. Immersing the PCB in a 10% solution of sulfuric acid with the application of ultrasonic and mechanical agitation (if the conductor spacing is less then 5 mils, the solution is reduced to approximately 1 to 5% sulfuric acid);
3. Rinsing in overflowing de-ionized water;
4. Immersing the PCB in a 5% solution of sulfuric acid with the application of ultrasonic and mechanical agitation. This second sulfuric acid wash preferably is not followed by a rinse;
5. Plating the copper with palladium by immersing the PCB in a palladium activation solution at approximately 30° C. with the application of ultrasonic agitation for 5 seconds at 30 second intervals. The PCB should be initially positioned at a 45° angle and be flipped approximately half way through the process to the opposing 45° angle;
6. Rinsing with de-ionized water in an overflowing beaker for approximately 30 seconds;

7. Post dipping in a 1% solution of sulfuric acid to help eliminate bridge plating;
8. Rinsing in overflowing de-ionized water;
9. Immersing in a bath of electroless nickel at approximately 80° C. without ultrasonic agitation, but with mechanical agitation;
10. Rinsing in overflowing de-ionized water;
11. Nitrogen blow drying;
12. Visually inspecting for full nickel coverage of the copper;
13. Immersing in an approximately 30% solution of hydrochloric acid with manual agitation, followed by a overflowing de-ionized water rinse
14. If full nickel coverage was not achieved, repeating steps 4 through 13;
15. Immersing in a gold flash plating solution at approximately 90° and a pH of 4.5 to 4.7 to establish a first thin layer of electroless gold;
16. Rinsing in overflowing de-ionized water;
17. Immersing in an autocatalytic gold plating bath at approximately 70° C. for sufficient time to achieve the desired over all gold thickness;
18. Rinsing in overflowing de-ionized water;
19. Blow drying with dry nitrogen.

DETAILED DESCRIPTION

The process of electrolessly gold plating the copper patterns on a printed board in accordance with the present invention comprises three broad steps. They are (1) nickel plating to achieve good adherence of the gold to the copper, (2) immersion plating with a thin layer of gold, and (3) building up the thickness of the gold by autocatalytic gold plating with a second layer of gold. The primary goal of the process is to obtain a complete and uniform layer of gold of the desired thickness, typically 40–60 micro-inches, that is well adhered to the copper, and is of sufficient quality (fine, uniform grains) to provide an excellent gold ball bonding surface.

Each of the three general steps mentioned above comprise a plurality of substeps.

Described below is one particular embodiment of the present invention. It should be understood that many, if not all, of the specific process parameters and steps can be modified without departing from the spirit of the present invention. Furthermore, the process described below is presented with various headings and subheadings with the intent of making this specification more easily readable and better organized. However, the headings and subheadings are not intended to suggest any particular necessary relationships of the steps to each other and are merely for organizational purposes.

Figure 2A:
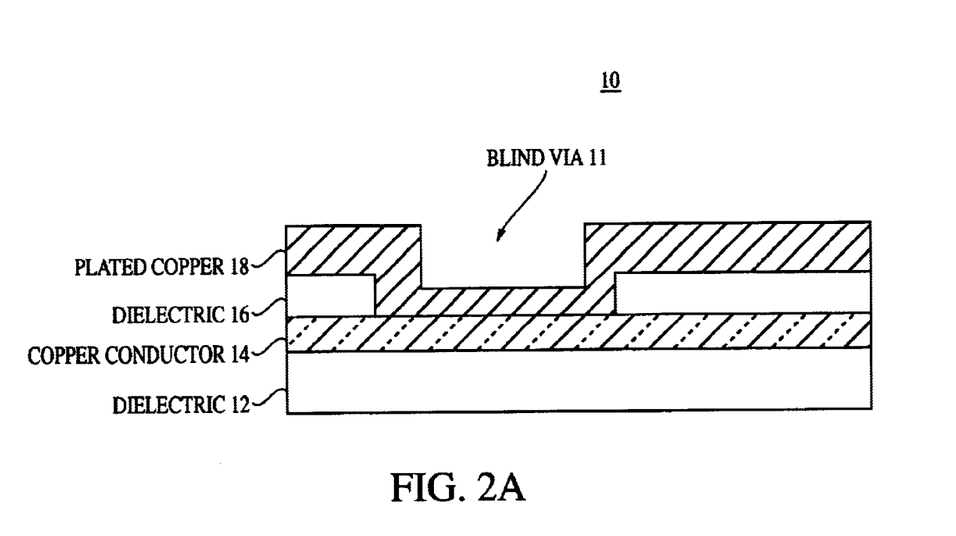
FIG. 2a is a cross-sectional side view of a printed circuit board during a first phase of fabrication in accordance with the present embodiment of the invention.

The process of the present invention assumes that a printed circuit board (PCB) with patterned copper plating and including blind vias has been prepared by a suitable technique and is essentially ready for gold plating in accordance with the present invention. FIG. 2A is a cross-sectional side view of a portion of such a PCB 10. It comprises multiple dielectric layers 12, 16 containing various copper patterns. Shown in FIG. 2A is a copper conductor 14 on dielectric layer 12 and a blind via 11 through dielectric layer 16 to the copper conductor 14 on underlying dielectric layer 12. The via is plated with copper 18.

Figure 3:
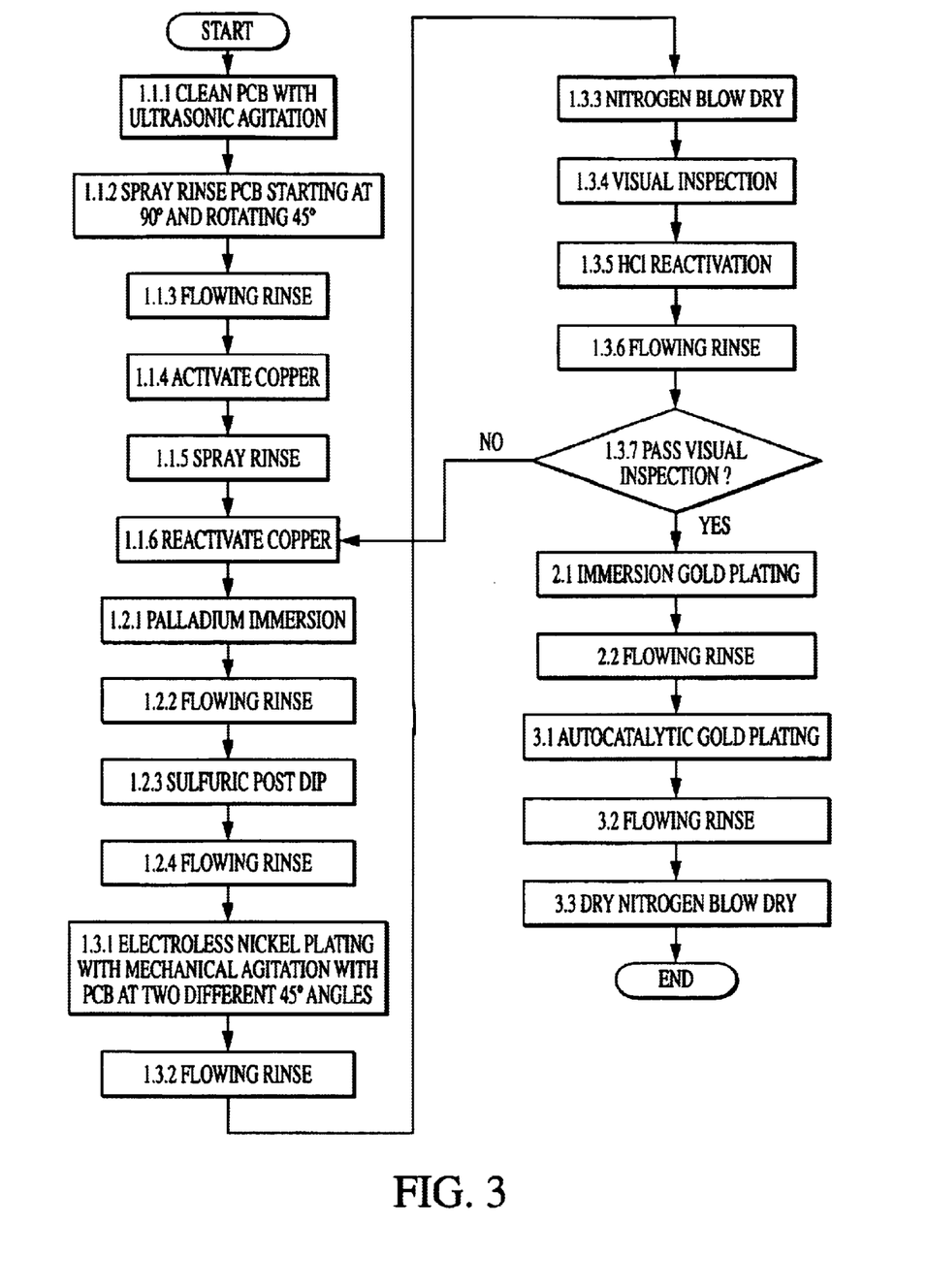
FIG. 3 is a flow diagram illustrating steps in accordance with a preferred embodiment of the present invention.

FIG. 3 is a flow diagram outlining the steps set forth below and can be referenced as needed. However, the flowchart is not specifically referenced below.

In most, if not all, known techniques for forming copper traces on a PCB, the copper has likely been etched and developed one or more times using different etching and developing solutions which should be thoroughly removed from the PCB prior to adding any additional plating materials.

1. Nickel Plating

Before the copper can be plated with nickel, it should be cleaned, rinsed and activated. Activation involves replacement of any copper oxide layer that has formed on top of the copper with a palladium layer (the palladium layer will then eventually be replaced with the nickel layer).

1.1 Clean and Rinse

1.1.1 The printed circuit board with patterned copper is placed in a beaker containing a cleaning solution. In a preferred embodiment of the invention, the cleaning solution comprises a 25% solution of LAC-81 cleaning solution manufactured by Dynachem Products, Inc. of B.C., Canada and 75% de-ionized water. The solution should be maintained at about 55° C. In a preferred embodiment, the PCB is immersed in the cleaning solution for about 5 minutes during which time ultrasonic agitation is applied to the solution. In a preferred embodiment of the invention, the ultrasonic agitation is applied through an ultrasonic water jacket bath essentially comprising a metal tub within which the beaker containing the PCB is submerged.

1.1.2 The ultrasonic cleaning is followed by a high pressure spray rinse of nitrogen and de-ionized water. Preferably, the board initially is oriented vertically (i.e., with the planar surfaces of the PCB oriented at a 90° angle to the floor) and gradually rotated to a 45° angle during the course of the rinse. The pressure spray can be at a pressure of approximately 30 pounds per square inch for approximately 1 minute.

1.1.3 The PCB is then further rinsed for 30 seconds in a beaker with overflowing de-ionized water flowing at a rate of approximately 1 gallon per minute.

1.1.4 The copper is then activated (i.e., any copper oxide layer that has formed on the copper is removed) in a solution of sulfuric acid and de-ionized water. If the copper spacing on the PCB is greater than or equal to 5 mils (1 mil=1/1000 of an inch), the solution may be 10% sulfuric acid to 90% de-ionized water. If the line spacing is less than 5 mil, the solution should be between 1 and 5% sulfuric acid. The printed circuit board is immersed in the solution at a 90° angle to the floor for approximately 2 minutes at room temperature. The board is mechanically agitated as well as ultrasonically agitated for the duration of the immersion.

1.1.5 The board is then rinsed again with a combination of nitrogen and de-ionized water for approximately 1 minute with the pressure of approximately 30 pounds per square inch. The board is initially oriented at 90° and gradually rotated to 45°.

1.1.6 Next, the board is again immersed in sulfuric acid, this time a 5% solution, for approximately 1 minute at room temperature. No rinse is performed after this step.

1.2 Palladium Activation

1.2.1 In a preferred embodiment of the invention, directly after the 5% sulfuric acid immersion, the PCB is immersed in a solution of KAT 450, which is a palladium activation solution manufactured for the semiconductor fabrication industry by Uyemura International Corporation of Ontario, Calif., USA. However, other palladium activation solutions are available and can be used. For fine line PCBs (i.e., generally less than 5 mil spacing) a solution of 3 ml of KAT 450 per liter of de-ionized water and 10% sulfuric acid is preferred.

The palladium layer is needed because nickel will not bond well to bare copper because bare copper is extremely reactive with oxygen and begins oxidizing immediately even in low oxygen environments. The palladium layer essentially replaces the copper oxide layer and then the palladium layer will eventually be replaced by the nickel layer.

The process is carried out preferably at a controlled temperature of approximately 30° C. and with application of ultrasonic agitation. The ultrasonic agitation helps solution exchange in the blind vias, which has been a particular problem in the prior art, especially with respect to vias with high aspect ratios. However, the ultrasonic agitation should be precisely controlled since too much ultrasonic agitation provides too much palladium activation, which could lead to bridge plating of the palladium (i.e., palladium bridging the gap between two adjacent copper traces that are not intended to be electrically connected). If not enough ultrasonic agitation is applied, the palladium plating will be insufficient, particularly in the blind vias.

In a preferred embodiment of the invention, the ultrasonic agitation is applied for the first 5 seconds of immersion of the board followed by 25 seconds with the ultrasonic agitation turned off, followed by another 5 seconds of ultrasonic agitation, followed by 25 seconds of no ultrasonic agitation. This pattern is repeated for the duration of the immersion.

In a preferred embodiment of the invention, the PCB is immersed in the palladium activation solution with the PCB oriented at 45° to the floor. Half way through the process, the board is flipped to the opposing 45° angle to the floor. This flipping allows blind vias on opposing surfaces of the PCB to receive essentially equal treatment. In a preferred embodiment, the PCB is immersed in the palladium activation solution for approximately 3 minutes.

1.2.2 The palladium activation is followed by 30 seconds of flowing de-ionized water rinse at a rate of approximately one gallon per minute.

1.2.3 Next, in order to thin out the palladium layer and make it uniform, the PCB immersed in a sulfuric acid post dip for about one minute. The solution for this step is preferably 1% sulfuric acid to 99% de-ionized water. The board is oriented at a 90° angle.

1.2.4 The post dip is followed by 30 seconds of rinsing with over flowing de-ionized water at a rate of approximately 1 gal. per minute.

Figure 2B:
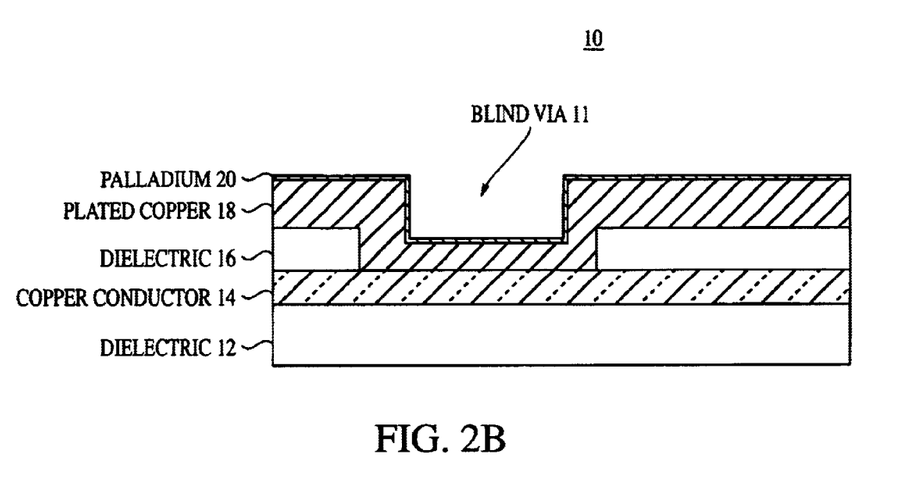
FIG. 2b is a cross-sectional side view of a printed circuit board during a second phase of fabrication in accordance with the present embodiment of the invention.

FIG. 2B shows the PCB after the palladium activation portion of the process. As shown, a thin layer of palladium 20 has been plated on top of the copper layer 18.

1.3 Immersion Electroless Nickel Plating

The PCB is now activated and prepared for electroless nickel plating.

1.3.1 The board is immersed into a bath of electroless nickel plating solution. In one preferred embodiment of the invention, the solution is Nimuden NPR-4 produced by Uyemura International Corporation. The solution should be heated to 80° C. and the immersion should last approximately 30 minutes. In a preferred embodiment of the present invention, the board is oriented at a 45° angle and is coupled to a cathode rocker arm which continuously mechanically moves the board to and for in the solution. (Note that the term "cathode rocker arm" describes a well known device in the art and that the term "cathode" should not be taken to indicate that the process is electrolytic; as noted, the process is an electroless plating process). Preferably, no ultrasonics are applied during this step.

Tiny hydrogen gas bubbles tend to form in the electroless nickel plating solution. Such bubbles have a tendency to become trapped in blind vias and, hence, prevent the nickel solution from achieving full penetration into such blind vias and prevent spent solution from exiting the blind vias. It is believed that the mechanical agitation and the 45° orientation of the board are instrumental in preventing such hydrogen bubbles from becoming trapped in the blind vias.

1.3.2 The electroless nickel plating is followed by a one minute flowing de-ionized water rinse at a rate of one gallon per minute.

1.3.3 The rinse is then followed by a dry nitrogen blow dry.

1.3.4 At this point, the PCB is removed from processing for visual inspection to determine if the nickel plating has fully covered the copper on the PCB. Preferably, this is done under about 10× magnification.

1.3.5 Whether or not the part passes this inspection, it may be immersed in a solution of 30% hydrochloric acid (HCl) to 70% de-ionized water for three minutes with mechanical agitation of the board. The purpose of the hydrochloric acid wash is to reactivate the palladium for additional nickel plating, if full coverage has not been achieved, or to reactivate the nickel for the electroless gold plating, as the case may be. Particularly, because the Palladium and/or nickel plating has a tendency to begin oxidizing immediately, it is generally believed necessary that, upon completion of the nickel plating step, the part must immediately be gold plated to minimize the amount of oxidation of the nickel that occurs before the gold is plated. This step reactivates the nickel (or any exposed palladium), thereby providing the ability to take the time necessary to remove the part from the fabrication process for the visual inspection of step 1.3.4.

1.3.6 Again, regardless whether or not the part passed visual inspection, the hydrochloric acid wash is followed by one minute of flowing de-ionized water rinse.

1.3.7 If it is determined in step 1.3.4 that the nickel plating did not fully cover the copper on the PCB, then steps 1.1.6 through 1.3.6 are repeated.

Figure 2C:
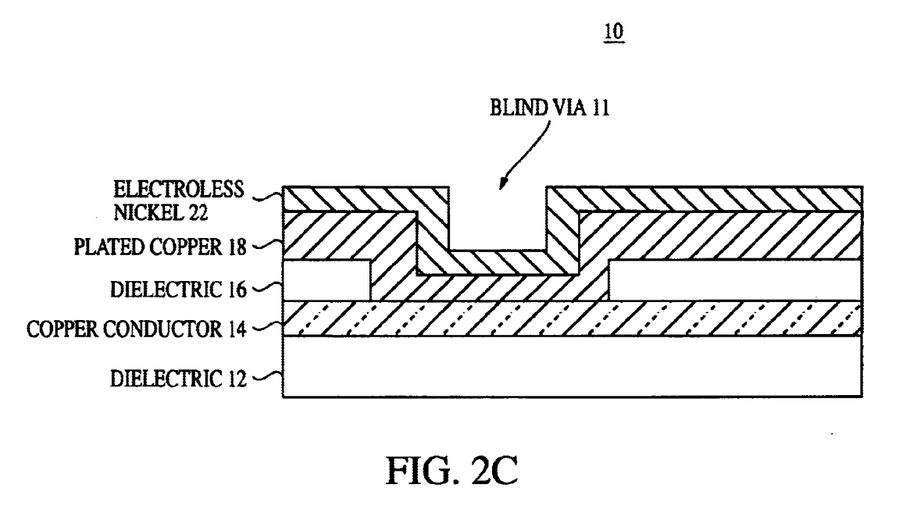
FIG. 2c is a cross-sectional side view of a printed circuit board during a third phase of fabrication in accordance with the present embodiment of the invention.

FIG. 2C shows the PCB after the nickel plating portion of the process is completed. As shown, the thin layer of palladium 20 from FIG. 2B has been replaced with a layer of nickel 22.

2. Immersion Gold Plating

The PCB is now ready for the first, immersion gold plating step.

2.1 While the first immersion gold plating step can be carried out using any number of available immersion gold plating solutions, in a preferred embodiment of the invention, the solution is Aruna 511 immersion gold produced by Uyemura International Corporation. Preferably, the solution is heated to 90° C. However, on the way up to 90° C., its pH is checked at approximately 70° C. It is preferable to check the pH at 70° C. because most pH meters will be rendered inoperable or, at least, adversely affected, if exposed to 90° C. temperatures. Also, pH testing at room temperature will not give an accurate reading of the pH of the solution at 90° C.

The pH should be in the range of approximately 4.5 to 4.7. If it is not within that range, it needs to be adjusted. Preferably, if the pH is too low, it is raised by adding to the solution a one to one mixture of 30% ammonium hydroxide and de-ionized water. If the pH is too high, preferably, it is lowered with Aruna acid salts or a citric acid solution.

The plating rate for Aruna 511 at 90° C. is approximately 0.2 to 0.4 micro-inches per minute. A layer of approximately 6 to 8 micro-inches of the immersion gold is preferred. Accordingly, this first gold plating step preferably is carried out for approximately 15 minutes. Preferably, no ultrasonic agitation is applied during this step.

2.2 The immersion is then followed by a one minute flowing de-ionized water rinse.

Figure 2D:
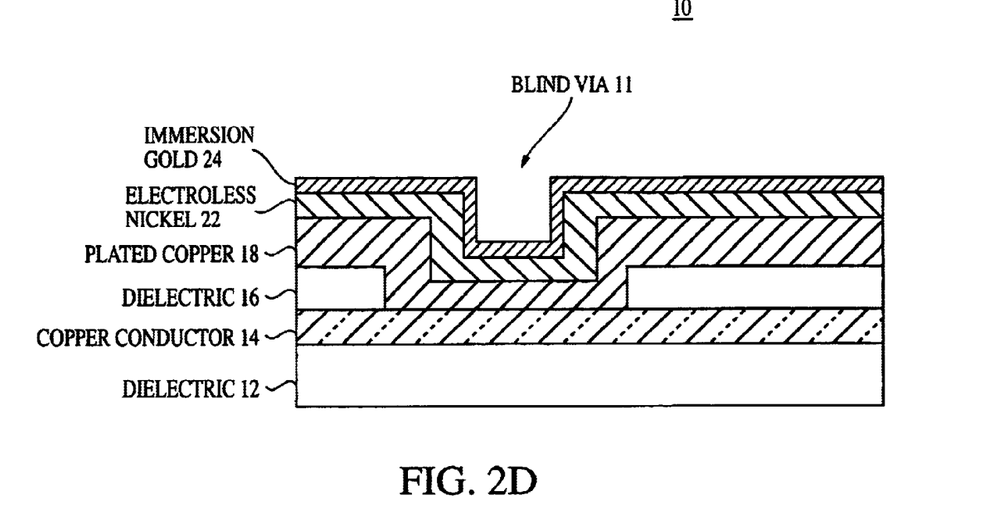
FIG. 2d is a cross-sectional side view of a printed circuit board during a fourth phase of fabrication in accordance with the present embodiment of the invention.

FIG. 2D shows the PCB after this step. As shown, a thin layer of gold 24 has been plated on top of the nickel layer 22.

3. Autocatalytic Gold Plating

The PCB is now ready for the second, autocatalytic gold plating step.

3.1 Again, any number of autocatalytic gold plating solutions that are suitable for use in the present invention are available on the market. In one preferred embodiment of the invention, the solution is NEORUM TWB produced by Uyemura International Corporation. The NEORUM TWB bath should be heated to approximately 70° C. The board should be oriented at a 90° angle to the floor. No mechanical or ultrasonic agitation should be applied during this step. Particularly, it has been found that there is a tendency for "comet tailing" to occur during autocatalytic gold plating. "Comet tailing" is a phenomenon in which the gold plating leaves a streak of unplated, or at least much more thinly plated, gold near through holes and vias in the PCB. The name comes from the fact that the appearance under magnification when this occurs looks like a comet tail flowing away from the via.

The plating rate for NEORUM TWB at 70° is approximately 40 micro-inches per hour. In order to provide sufficient gold for the formation of high reliability wirebonding, a gold layer of at least 20 micro-inches is desired, and preferably about 40–50 micro-inches. Accordingly, the PCB should be processed in the autocatalytic bath for approximately one hour.

3.2 The autocatalytic gold bath is followed by 5 minutes of over flowing de-ionized water rinse.

3.3 The process is completed with a dry nitrogen blow dry of the part.

Figure 2E:
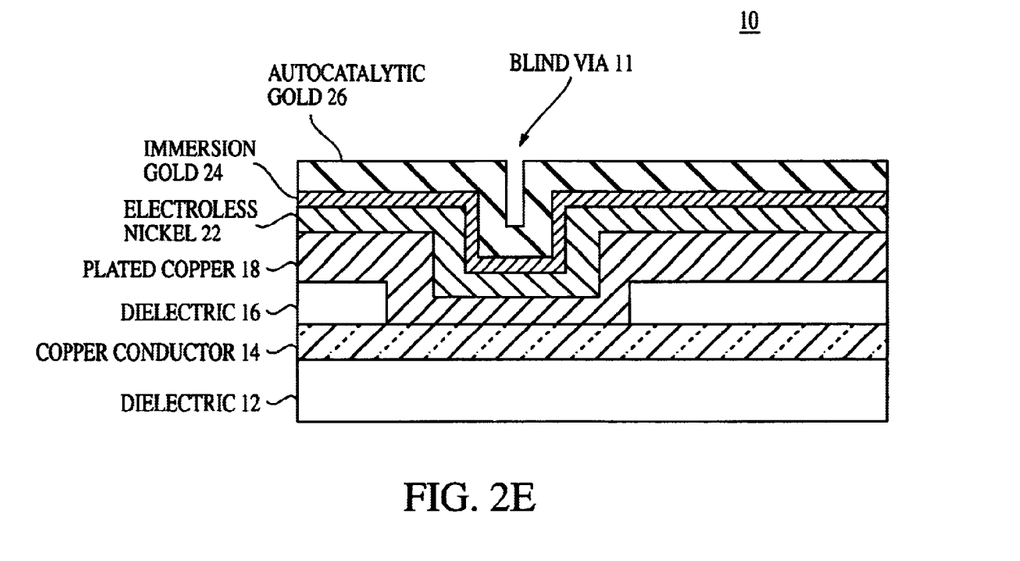
FIG. 2e is a cross-sectional side view of a printed circuit board during a fifth phase of fabrication in accordance with the present embodiment of the invention.

FIG. 2E shows the PCB after the autocatalytic gold plating step. As shown, additional gold layer 26 has been plated on top of the first gold layer 24.

Conclusion

Empirical testing has established that the above identified technique provides a highly suitable surface for wirebonding. For instance, Table 1 shows the results of destructive pull tests of wirebonds on a PCB fabricated generally in accordance with the embodiment of the present invention described above. Tests were performed for various gold layer thicknesses, namely, 0.4 microns, 0.65 microns and 0.9 microns.

| Au Thickness, PM | Number of Bonds | Failures in nondestructive pull test at 2.48 grams force | Destructive Pull Test Pull Strength in grams | |
|---|---|---|---|---|
| | | | As Bonded | Post Thermal Aging |
| 0.40 | 129 | 1 | 10.6 | 9.8 |
| 0.65 | 149 | 0 | 10.0 | 10.1 |
| 0.90 | 138 | 0 | 9.4 | 10.6 |

The destructive pull test data is based on the average of approximately 70 bonds. Standard deviations are about 10–12% for all samples. The aging employed for the post thermal aging test comprised heating at 150° C. for 160 hours prior to the destructive pull test.

It is believed that the ultrasonic agitation and/or the vigorous cleaning and rinsing steps are instrumental in achieving these excellent pull strength results.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

We claim:

1. A method of electrolessly gold plating copper portions on a printed circuit board (PCB), said method comprising the steps of:

(1) cleaning said PCB, said cleaning including immersing said PCB in a cleaning solution and applying ultrasonic agitation to said cleaning solution during said immersion;

(2) activating said copper portions comprising the steps of:

(2.1) immersing said PCB in a first solution comprising sulfuric acid and applying ultrasonic agitation to said first solution during said immersion;

(2.2) rinsing said PCB after step (2.1); and         (2.3) after step (2.2), immersing said PCB in a second solution comprising sulfuric acid and applying ultrasonic agitation to said second solution during said immersion     (3) depositing a layer of palladium on said copper portions;

(4) electrolessly plating said copper portions with nickel;

(5) electrolessly plating said copper portions with a first layer of gold; and     (6) autocatalytically plating said copper portions with a second layer of gold.

2. The method of claim 1 wherein said copper portions of said PCB have minimum spacing of at least 5 mils, and wherein said first sulfuric acid solution comprises 10% sulfuric acid and said second sulfuric acid solution comprises 5% sulfuric acid.

3. The method of claim 1 wherein said copper portions of said PCB have minimum spacing of less than 5 mils, and wherein said first sulfuric acid solution comprises 1% sulfuric acid and said second sulfuric acid solution comprises 5% sulfuric acid.

4. The method of claim 1 wherein step (3) is performed after step (2.2) without an intermediate rinsing step.

5. The method of claim 1 wherein step (2.2) comprises spraying said PCB with nitrogen and de-ionized water for a period of time, and commencing said step with said PCB oriented at a 90° angle to the floor and gradually rotating it to a 45° angle to the floor during said period of time.

6. The method of claim 1 wherein step (3) comprises immersing said PCB in a solution comprising palladium and applying ultrasonic agitation to said solution during said immersion,
wherein step (3) further comprises orienting said PCB at a first 45° angle to said floor for approximately half of a duration of said step and then flipping said PCB to a second 45° angle to said floor for a remainder of said step.

7. The method of claim 1 wherein step (4) comprises the steps of:
immersing said PCB in a solution of electroless nickel, said PCB oriented at an angle of 45° to the floor; and mechanically agitating said PCB while in said solution,
wherein step (4) is performed with said solution at 80° C. and wherein said mechanical agitation is continual,
wherein step (4) further comprises the steps of:
determining if said copper portions of said PCB have been fully covered with nickel; immersing said PCB in a solution comprising hydrochloric acid: rinsing said PCB with de-ionized water; if said copper portions of said PCB have not been fully covered with nickel, repeating steps (3) and (4),
wherein step (4) further comprises the step of, prior to repeating steps (3) and (4), immersing said PCB in a third solution comprising sulfuric acid and applying ultrasonic agitation to said third solution during said immersion.

8. A method of electrolessly gold plating copper portions on a printed circuit board (PCB), said method comprising the steps of:
(1) cleaning said PCB, said cleaning including immersing said PCB in a cleaning solution and applying ultrasonic agitation to said cleaning solution;
(2) spraying said PCB with nitrogen and de-ionized water for a period of time, and commencing said step with said PCB oriented at a 90° angle to the floor and gradually rotating it to a 45° angle to the floor during said period of time;
(3) immersing said PCB in a first solution comprising sulfuric acid and applying ultrasonic agitation to said first solution during said immersion;
(4) rinsing said PCB with overflowing de-ionized water;
(5) immersing said PCB in a second solution comprising sulfuric acid and applying ultrasonic agitation to said second solution during said immersion;
(6) immersing said PCB in a solution comprising palladium and applying ultrasonic agitation to said solution during said immersion;
(7) rinsing said PCB with overflowing dc-ionized water;
(8) immersing said PCB in a 1% solution of sulfuric acid;
(9) immersing said PCB in a solution of electroless nickel, said PCB oriented at an angle of 45° to the floor and mechanically agitating said PCB while in said solution;
(10) rinsing said PCB with overflowing de-ionized water;
(11) determining if said copper portions of said PCB have been fully covered with nickel;
(12) immersing said PCB in a solution comprising hydrochloric acid;
(13) rinsing said PCB with de-ionized water;
(14) if said copper portions of said PCB have not been fully covered with nickel, repeating steps (5) through (13);
(15) electrolessly plating said copper portions with a first layer of gold;
(16) rinsing said PCB with overflowing dc-ionized water;
(17) autocatalytically plating said copper portions with a second layer of gold with no agitation; and
(18) rinsing said PCB with overflowing dc-ionized water.

9. The method of claim 8 wherein said copper portions of said PCB have minimum spacing of at least 5 mils, and wherein said first sulfuric acid solution comprises 10% sulfuric acid and said second sulfuric acid solution comprises 5% sulfuric acid.

10. The method of claim 8 wherein said copper portions of said PCB have minimum spacing of less than 5 mils, and wherein said first sulfuric acid solution comprises 1% sulfuric acid and said second sulfuric acid solution comprises 5% sulfuric acid.

11. The method of claim 8 wherein step (6) is performed after step (5) without an intermediate rinsing step.

12. The method of claim 11 wherein said palladium solution further comprises sulfuric acid and wherein step (6) comprises applying said ultrasonic agitation for 5 second periods at 30 second intervals.

13. The method of claim 11 wherein step (6) further comprises orienting said PCB at a first 45 angle to said floor for approximately half of a duration of said step and then flipping said PCB to a second 45 angle to said floor for a remainder of said step.

14. The method of claim 13 wherein step (6) is performed at about 30° C. and for about 3 minutes.

15. The method of claim 14 wherein step (9) is performed with said solution at 80° C. and wherein said mechanical agitation is continual.

16. The method of claim 15 wherein step (11) comprises visually inspecting said copper portions of said PCB.

17. The method of claim 16 wherein step (15) comprises immersing said PCB in a solution comprising electroless gold at about 90° C. and having a pH of about 4.5 to about 4.7.

18. The method of claim 17 wherein step (15) is performed for a period sufficient to deposit a layer of gold of about 6 to about 8 micro-inches on said copper portions of said PCB.

19. The method of claim 18 wherein step (17) comprises immersing said PCB in a solution comprising autocatalytic gold at about 70° C. with said PCB oriented at 90° to the floor.

20. The method of claim 19 wherein no agitation of said solution or said PCB is applied during step (15).

21. The method of claim 20 wherein, in step (17), said PCB is immersed in said autocatalytic gold solution for a time sufficient to deposit about 40 micro-inches of additional gold on said copper portions of said PCB.

22. The method of claim 8 further comprising the step of:
(19) blow drying said PCB with dry Nitrogen.

* * * * *